United States Patent
Lu et al.

(10) Patent No.: US 8,687,402 B2
(45) Date of Patent: *Apr. 1, 2014

(54) SILICON-BASED NANOSCALE RESISTIVE DEVICE WITH ADJUSTABLE RESISTANCE

(75) Inventors: Wei Lu, Ann Arbor, MI (US); Sung Hyun Jo, Ann Arbor, MI (US); Kuk-Hwan Kim, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 1006 days.

This patent is subject to a terminal disclaimer.

(21) Appl. No.: 12/575,921

(22) Filed: Oct. 8, 2009

(65) Prior Publication Data

US 2010/0085798 A1 Apr. 8, 2010

Related U.S. Application Data

(60) Provisional application No. 61/103,928, filed on Oct. 8, 2008.

(51) Int. Cl.
*G11C 11/21* (2006.01)

(52) U.S. Cl.
USPC .............. 365/148; 365/63; 365/51; 365/151; 257/4; 257/E47.001; 977/943

(58) Field of Classification Search
USPC ............... 365/148, 151, 163, 51, 63; 257/4, 257/E47.001; 977/943
See application file for complete search history.

(56) References Cited

U.S. PATENT DOCUMENTS

| | | | | |
|---|---|---|---|---|
| 3,740,620 A | * | 6/1973 | Agusta et al. ................. | 257/200 |
| 4,569,121 A | * | 2/1986 | Lim et al. ...................... | 438/467 |
| 4,684,972 A | * | 8/1987 | Owen et al. ..................... | 257/2 |
| 8,071,972 B2 | * | 12/2011 | Lu et al. ............................ | 257/5 |
| 2004/0012035 A1 | * | 1/2004 | Branz et al. .................... | 257/130 |
| 2004/0026682 A1 | | 2/2004 | Jiang | |
| 2005/0029587 A1 | | 2/2005 | Harshfield | |
| 2005/0121742 A1 | * | 6/2005 | Petti et al. ...................... | 257/530 |
| 2005/0121743 A1 | * | 6/2005 | Herner .......................... | 257/530 |
| 2008/0106925 A1 | | 5/2008 | Paz de Araujo et al. | |

(Continued)

OTHER PUBLICATIONS

Choi, Jang Wook (2007) Bistable [2]Rotaxane Based Molecular Electronics : Fundamentals and Applications, Chapter 3, "Molecular Electronic Crossbar Memory Circuits", 46 pages. Dissertation, California Institute of Technology http://resolver.caltech.edu/CaltechETD:etd-05242007-194737.

(Continued)

*Primary Examiner* — J. H. Hur
(74) *Attorney, Agent, or Firm* — Reising Ethington P.C.

(57) ABSTRACT

A non-volatile solid state resistive device that includes a first electrode, a p-type poly-silicon second electrode, and a non-crystalline silicon nanostructure electrically connected between the electrodes. The nanostructure has a resistance that is adjustable in response to a voltage being applied to the nanostructure via the electrodes. The nanostructure can be formed as a nanopillar embedded in an insulating layer located between the electrodes. The first electrode can be a silver or other electrically conductive metal electrode. A third (metal) electrode can be connected to the p-type poly-silicon second electrode at a location adjacent the nanostructure to permit connection of the two metal electrodes to other circuitry. The resistive device can be used as a unit memory cell of a digital non-volatile memory device to store one or more bits of digital data by varying its resistance between two or more values.

30 Claims, 11 Drawing Sheets

(56) References Cited

U.S. PATENT DOCUMENTS

2008/0116540 A1*  5/2008  Wang et al. .................. 257/530
2009/0014707 A1   1/2009  Lu et al.
2010/0102290 A1   4/2010  Lu et al.

OTHER PUBLICATIONS

Sung-Hyun Jo and Wei Lu, A Silicon-Based Crossbar Ultra-High-Density Non-Volatile Memory, SSEL Annual Report 2007, 1 page.

Supplementary European Search Report for EP 09 81 9890, 5 pages.

Yajie Dong et al. "Si/a-Si Core/Shell Nanowires as Nonvolatile Crossbar Switches", Nano Letters, ACS, US, vol. 8, No. 2, Feb. 13, 2008 pp. 386-391.

International Search Report for PCT/US2009/060023, May 18, 2010, 3 pages.

Waser, R.; Aono, M., Nanoionics-based Resistive Switching Memories, Nature Materials, Nov. 2007, vol. 6, pp. 833-835.

* cited by examiner

SILICON-BASED NANOSCALE RESISTIVE DEVICE WITH ADJUSTABLE RESISTANCE

CROSS-REFERENCE TO RELATED APPLICATION

This application claims the benefit of Provisional Application No. 61/103,928 filed Oct. 8, 2008, the contents of which are hereby incorporated by reference.

TECHNICAL FIELD

The invention relates to two-terminal non-volatile solid state resistive devices having an adjustable resistance that can be used for memory storage and controllable circuit interconnects.

BACKGROUND OF THE INVENTION

Resistive random-access memories (RRAMs) have generated significant interest recently as a potential candidate for ultra-high density non-volatile information storage. A typical RRAM device consists of an insulator layer sandwiched between a pair of electrodes and exhibits electrical pulse induced hysteretic resistance switching effects. The resistance switching has been explained by the formation of conductive filaments inside the insulator due to Joule heating and electrochemical processes in binary oxides (e.g. NiO and $TiO_2$) or redox processes for ionic conductors including oxides, chalcogenides and polymers. Resistance switching has also been explained by field-assisted diffusion of ions in $TiO_2$ and amorphous silicon (a-Si) films.

In the case of a-Si structures, voltage-induced diffusion of metal ions into the silicon leads to the formation of conductive filaments that reduce the resistance of the a-Si structure. These filaments remain after the biasing voltage is removed, thereby giving the device its non-volatile characteristic, and they can be removed by reverse diffusion of the ions back to the metal electrode under the motive force of a reverse polarity applied voltage.

Resistive devices formed by an a-Si structure sandwiched between two metal electrodes have been shown to exhibit this controllable resistive characteristic. However, such devices typically have micron sized filaments which may prevent them from being scaled down to the sub-100 nanometer range. Such devices may also require high forming voltages that can lead to device damage and can limit production yields.

SUMMARY OF THE INVENTION

In accordance with one aspect of the invention, there is provided a non-volatile solid state resistive device, comprising a first electrode, a p-type silicon second electrode, and a non-crystalline silicon nanostructure electrically connected between the electrodes. The nanostructure has a resistance that is adjustable in response to a voltage being applied to the nanostructure via the electrodes. The non-crystalline silicon nanostructure can be, for example, an amorphous silicon nanostructure or an amorphous poly-silicon nanostructure.

In accordance with another aspect of the invention, the resistive device is used as a memory cell in a digital non-volatile memory device. The memory device can include an array of such resistive devices which, in one embodiment provides a single bit of storage for each resistive device and, in another embodiment, provides multi-level number storage for each resistive device so that each memory cell can store more than one bit of data.

In accordance with another aspect of the invention, the resistive device is used as an electrical interconnect in an electronic circuit. The interconnect can be switched between at least a substantially conductive and substantially non-conductive state.

In accordance with yet another aspect of the invention, there is provided a non-volatile solid state resistive device, comprising a first metal electrode, a p-type poly-silicon electrode, an insulating layer located at least partially between the electrodes, an amorphous silicon structure embedded in the insulating layer, and a second metal electrode. The amorphous silicon structure has opposing end faces each connected to a different one of the electrodes. The first electrode comprises a metal that, in the presence of an applied voltage across the electrodes, supplies metal ions that form a filament within the silicon structure. As a result, the silicon structure exhibits a resistance that can be adjusted based on the applied voltage. The second metal electrode is in contact with the poly-silicon electrode at a location that is no more than 100 nm from the silicon structure.

In accordance with another aspect of the invention, there is provided a method of adjusting a non-volatile solid state switching device from an OFF state to an ON state, comprising the step of applying a voltage across a non-crystalline silicon nanostructure, wherein the applied voltage has a magnitude and duration that are selected so as to achieve a predetermined probability of the silicon nanostructure switching from the OFF state to the ON state.

BRIEF DESCRIPTION OF THE DRAWINGS

Preferred exemplary embodiments of the invention will hereinafter be described in conjunction with the appended drawings, wherein like designations denote like elements, and wherein.

DETAILED DESCRIPTION OF THE PREFERRED EMBODIMENTS

Figure 1A:
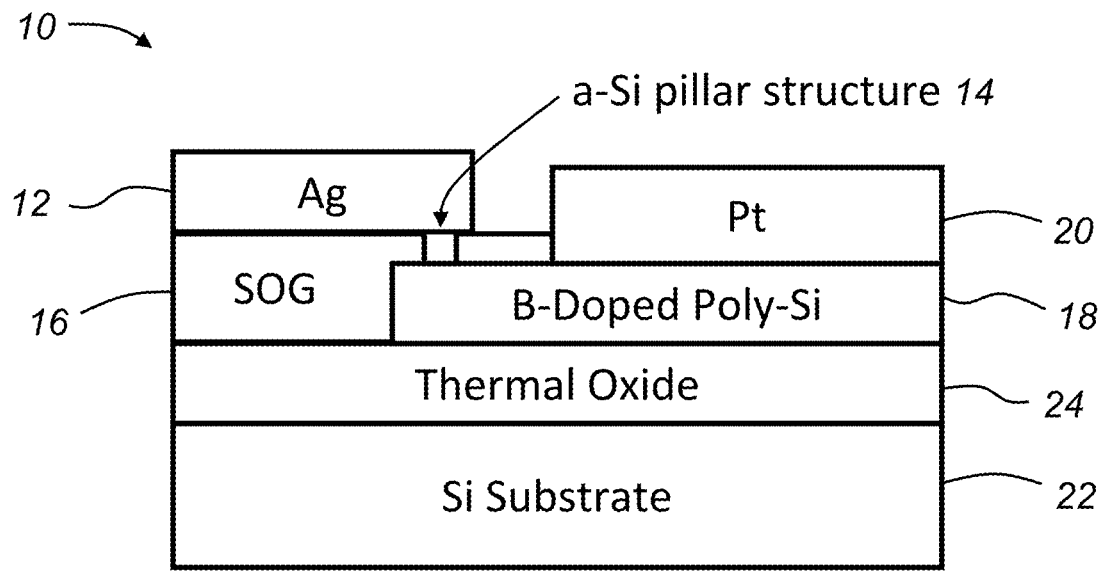
FIG. 1(a) is a diagrammatic view of one embodiment of a single cell a-Si resistive device constructed in accordance with the invention.

FIG. 1(a) depicts a non-volatile solid state resistive device 10 comprising a nanoscale a-Si structure 14 that exhibits a resistance that can be selectively set to various values, and reset, all using appropriate control circuitry. Once set, the resistance value can be read using a small voltage that is sufficient in magnitude to determine the resistance without causing it to change. Although the illustrated embodiment uses a-Si as the resistive element, it will be appreciated that other non-crystalline silicon (nc-Si) structures can be used, such as amorphous poly-silicon. Thus, as used herein and in the claims, non-crystalline silicon (nc-Si) means either amorphous silicon (a-Si), amorphous poly-silicon (poly-Si) that exhibits controllable resistance, or a combination of the two. Furthermore, although much of the discussion herein applies also to larger scale a-Si structures such as those having one or more dimensions in the micron range, the illustrated embodiment is an a-Si nanostructure that exhibits certain characteristics unique to its small scale. The term nanostructure, as used herein, refers to a structure having at least two dimensions in the nanoscale range; for example, structures having a diameter or plural cross-sectional dimensions within the general range of 0.1 to 100 nanometers. This includes structures having all three spatial dimensions in the nanoscale; for example, a cylindrical nanocolumn or nanopillar having a length that is on the same order as its nanoscale diameter. Nanostructures can include the various nanoscale structures known to those skilled in the art; for example, nanotubes, nanowires, nanorods, nanocolumns, nanopillars, nanoparticles, and nanofibers. One such structure 14 is the embodiment depicted in FIGS. 1(a) and 1(b), which is a plug or pillar structure that can be circular in cross-section with a diameter of less than 100 nm (e.g., 60 nm in the particular example shown). The pillar height or length, depending upon the orientation, can be nanoscale (e.g., 30 nm as in the illustrated example) or larger.

Figure 1B:
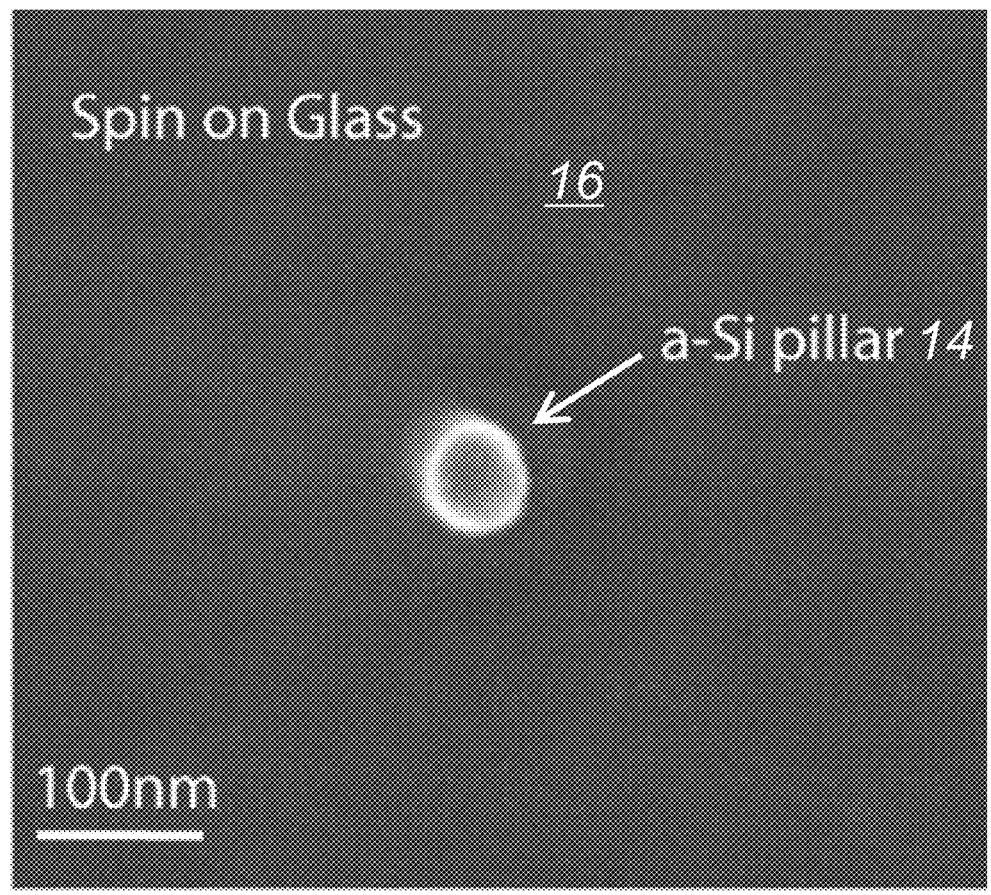
FIG. 1(b) is an SEM image of a top view of a partially-constructed a-Si structure such as shown in FIG. 1(a)

The a-Si structure 14 of FIGS. 1(a) and 1(b) is embedded in an insulating dielectric 16 which can be made of various materials and constructed in different ways, but as shown in the figures is a spin-on-glass (SOG) layer 16 that initially is flowed around the a-Si structure 14 and then solidified, all of which can be done using known processes. The overall resistive device 10 is built up using a silicon substrate layer 22 that is covered by a thermal dioxide layer 24. Underlying the a-Si pillar 14 is a boron-doped or other p-type poly-silicon electrode 18 that is in contact with a lower end face of the a-Si pillar 14 and that extends laterally away from the pillar to accommodate an overlying metal electrode 20 that can be made of any suitable metal, including, for example, a platinum group metal such as palladium or platinum. Opposite the poly-silicon (p-Si) electrode 18 on the upper surface (end face) of the a-Si pillar 14 is a silver (Ag) metal electrode 12 that acts as the source of filament-forming ions. Although silver is used in the illustrated embodiment, it will be understood that this electrode 12 (as well as the other metal electrode 20) can be formed from various other suitable metals, such as gold (Au), nickel (Ni), aluminum (Al), chromium (Cr), iron (Fe), manganese (Mn), tungsten (W), vanadium (V), cobalt (Co). Other suitable metals capable of supplying filament-forming ions can be used as well.

To fabricate the a-Si device 10 of FIG. 1(a), the B-doped p-Si bottom electrode layer 18 can be deposited by LPCVD (low pressure chemical vapor deposition) on a prime grade silicon substrate with a 200 nm thermal dioxide. The amorphous silicon layer can be a 30 nm thick layer deposited on top of the B-doped p-Si, followed by two RIE (reactive ion etching) steps to define the a-Si pillar 14 and the p-Si bottom electrode 18 structures. Spin-on-glass (SOG) can then be spin coated on the sample at a speed of 3000 RPM and then cured at 320° C. for 1 hour. This insulating SOG layer 16 provides electrical isolation of the two opposing electrodes 12,18 as well as mechanical support for the a-Si pillar 14. After being formed, the SOG layer 16 can be partially etched away to create a flat surface and to expose the end face of the a-Si pillar 14. The Ag electrode 12 can then be formed on the exposed end face of the a-Si pillar 14 by patterning using a lift-off process. Then the second metal (platinum) electrode 20 can be applied to provide ohmic contact to the bottom p-Si layer 18. The platinum electrode 20 is located near the a-Si pillar 14 to help minimize resistance through the p-Si electrode 18, and this distance is preferably no more than 100 nm. The pattern design can be chosen so as to minimize the overlap between the top and bottom electrodes 12,18 so as to keep a low direct leakage current through the SOG 16. It will be understood by those skilled in the art that various modifications to this fabrication procedure can be done, and that other fabrication approaches can be used as well to achieve either the structure of FIG. 1(a) or another suitable nc-Si structure that permits resistive adjustability of the device. U.S. Patent Application Publication No. 2009/0014707 A1 provides additional information concerning the characteristics, use, and operation of non-volatile solid state resistive switching devices such as the a-Si device shown in FIGS. 1(a) and 1(b). It also provides information concerning the construction of an alternative embodiment of an a-Si device, at least some of which is applicable to the construction of the a-Si device shown in FIGS. 1(a) and 1(b). The information contained in U.S. Patent Application Publication No. 2009/0014707 A1 concerning the fabrication, construction, and use of the non-volatile solid state resistive switching devices disclosed therein is hereby incorporated by reference.

A single a-Si device as shown in FIG. 1(a) can be used as a stand-alone reconfigurable interconnect or memory bit with its independently controlled top and bottom electrode pairs. The use of chemical-vapor deposition (CVD) deposited polysilicon as the bottom contact enables device fabrication on a variety of substrates including the potential for multi-layered 3D structure integration. As compared with a continuous a-Si film, the illustrated a-Si plug structure 14 helps ensure that the active a-Si region and the filament area are physically well defined. Furthermore, this construction of the device is fully compatible with CMOS technology and can be readily incorporated into existing systems as high-density non-volatile memories or as reconfigurable interconnects in logic circuits such as neuromorphic networks.

Figure 1C:
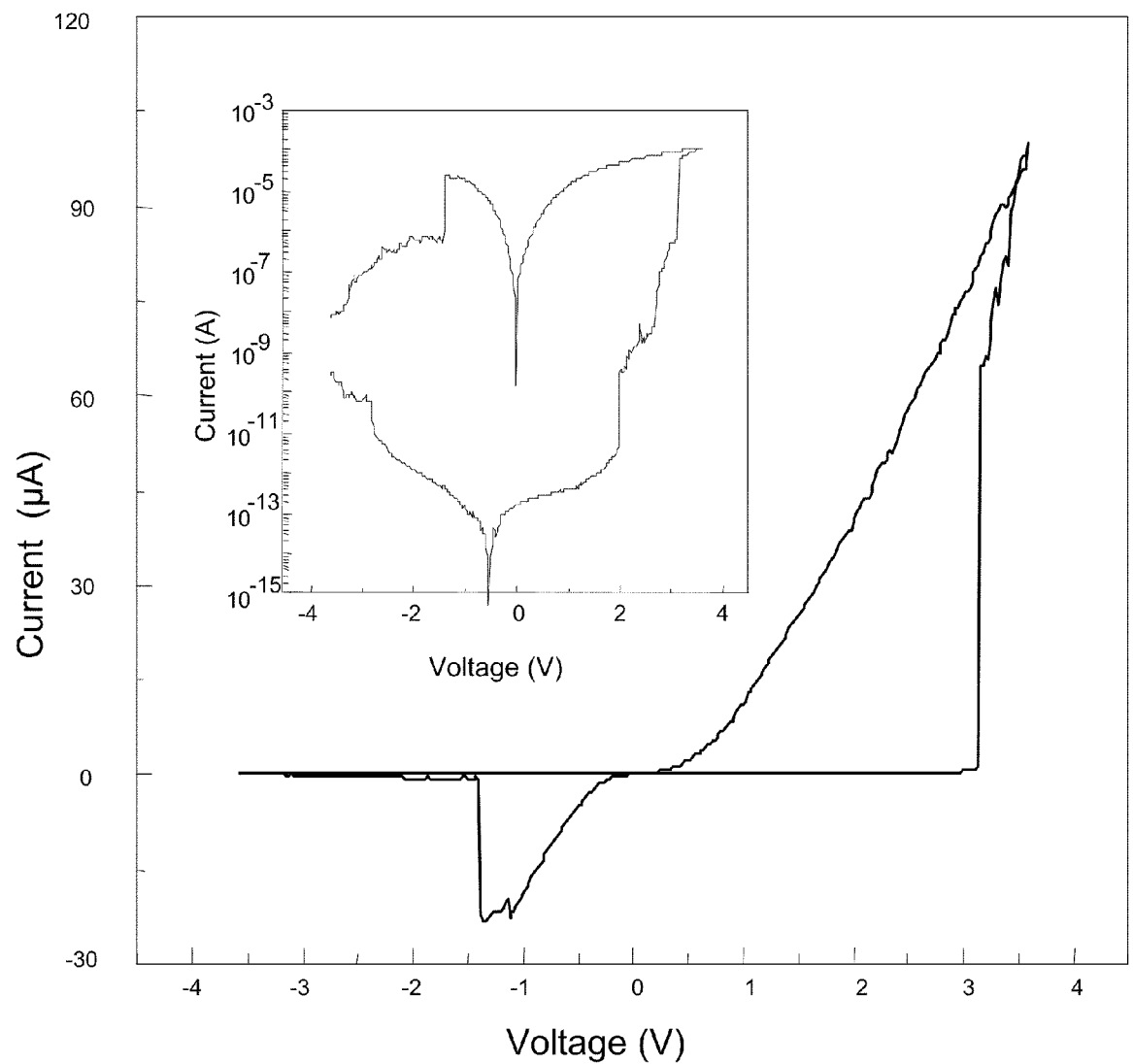
FIG. 1(c) is a graph showing resistance switching characteristic of a typical a-Si structure, such as shown in FIG. 1(a)
Figure 1D:
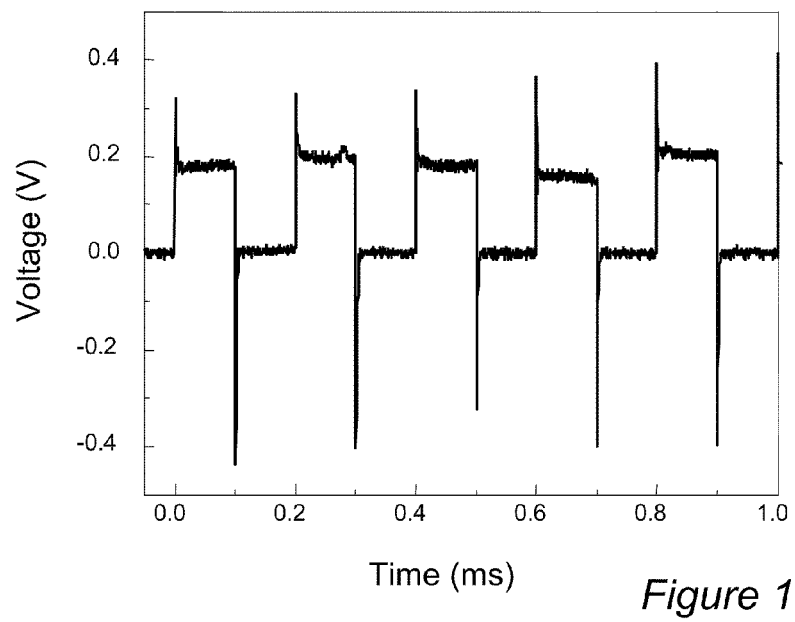
FIG. 1(d) is a waveform showing the programming response for an a-Si device such as shown in FIG. 1(a)
Figure 1E:
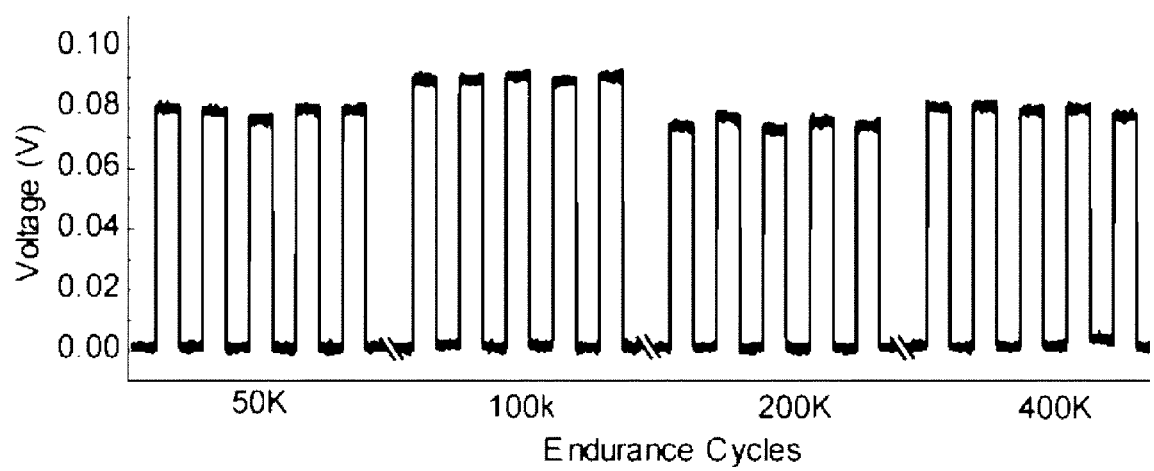
FIG. 1(e) is a waveform showing the results of endurance testing of an a-Si device such as shown in FIG. 1(a)

FIG. 1(c) shows the resistance switching characteristics of a typical a-Si pillar such as shown in FIG. 1(a); e.g., for a device with a diameter of about 60 nm and a thickness of 30 nm. It includes an inset graph of this switching characteristic in log scale showing the stepwise transition during the turn-on process. High voltage forming is not required for these nanoscale a-Si switches and the device after forming can be repeatedly switched between the low-resistance ON and high-resistance OFF states by applying positive write and negative erase voltage pulses. The ON/OFF resistance ratio measured at small bias can be as high as $10^7$, as indicated in FIG. 1(c). Testing of a-Si devices fabricated in the manner discussed above have shown that, as a memory device, the a-Si switch exhibits excellent performance metrics in terms of yield (e.g. >95% for devices with 60 nm diameter a-Si pillars), speed, endurance and retention. FIG. 1(d) shows a representative write-read-erase-read pulse sequence with 50 ns write/erase pulse widths and the output response from a typical device. Results from endurance test of the device are shown in FIG. 1(e). A typical device with on-current <20 µA is expected to survive greater than $10^5$ programming cycles without degradation. Beyond this limit the OFF state conductance can start to increase, thereby resulting in a reduced ON/OFF resistance ratio.

Figure 2A:
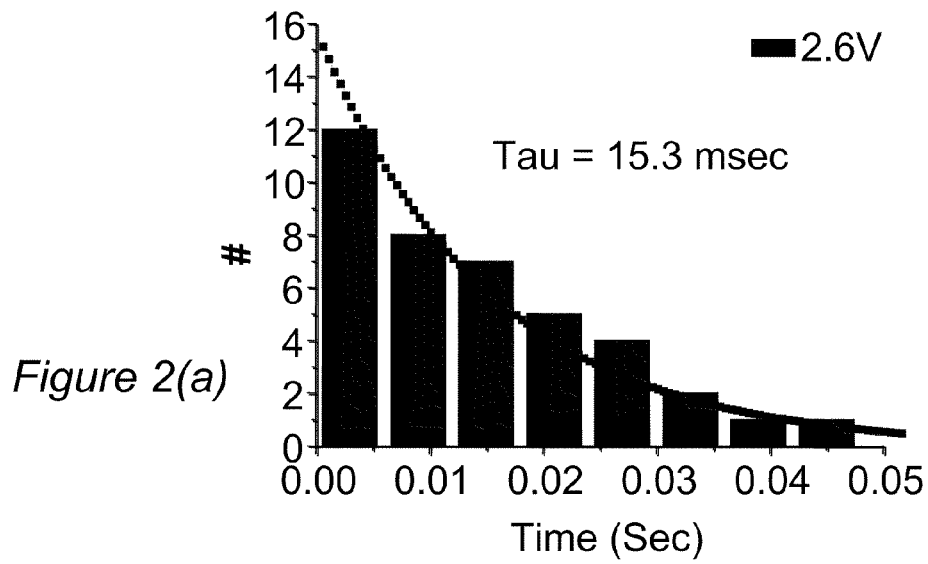
FIGS. 2(a)-2(c) depict histograms of the switching response of a typical a-Si device for different bias voltages.
Figure 2B:
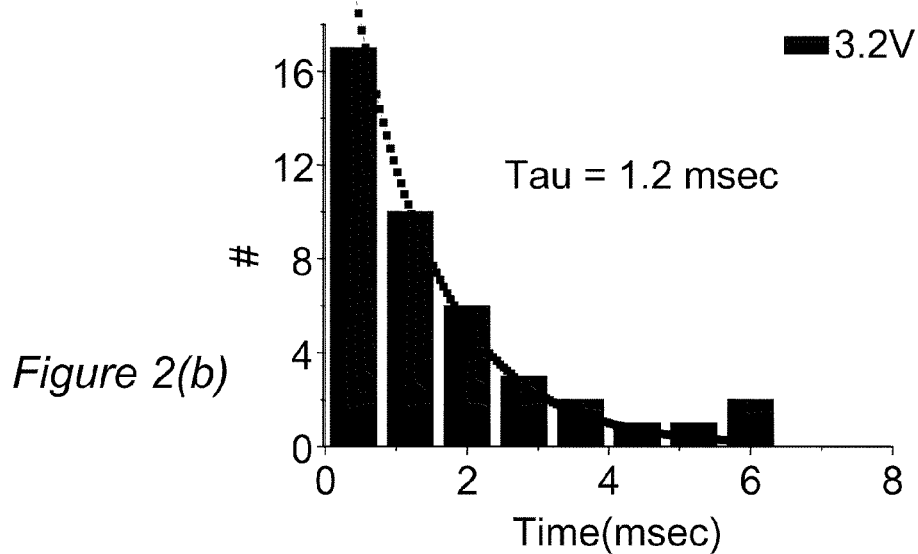
Figure 2C:
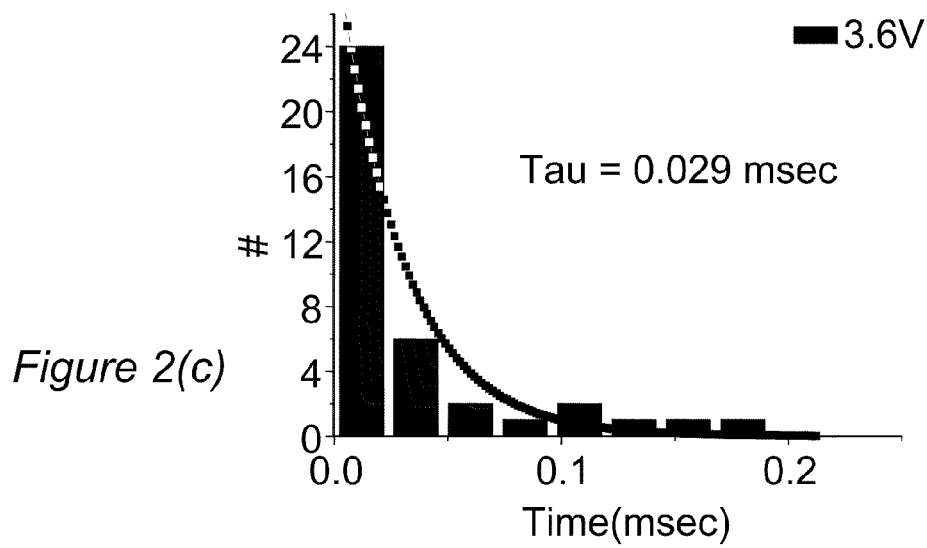
Figure 2D:
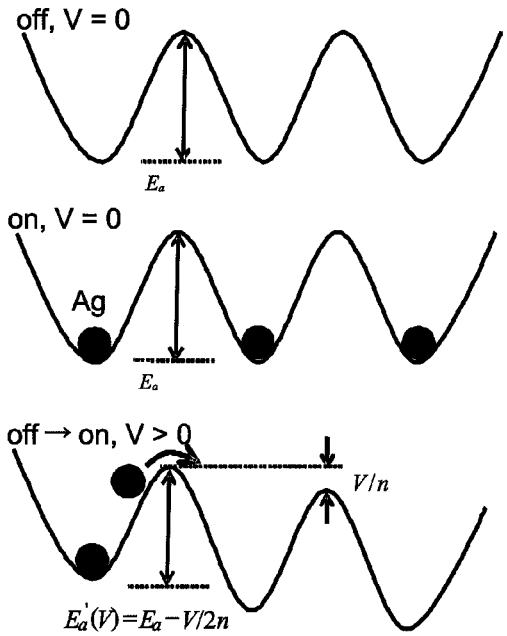
FIG. 2(d) is a three-part diagram showing the metal ion diffusion at different conductive states of an a-Si device such as shown in FIG. 1(a)

The switching in an a-Si structure can be explained by the formation and retrieval of a nanoscale Ag filament upon the application of the programming voltage, schematically illustrated in FIG. 2(d). In previous experimental and theoretical studies on microscale metal/a-Si/metal structures, the filament was suggested to be in the form of a series of positively charged Ag$^+$ particles trapped in defect sites in the a-Si layer. The conduction mechanism in the ON state is electron tunneling through the Ag$^+$ chain and the device resistance is then dominated by the tunneling resistance between the last Ag$^+$ particle and the bottom electrode. As indicated in FIG. 1(c), this behavior is consistent with the stepwise increase in current in log scale during the OFF-ON transition as the Ag filament grows in a step-by-step fashion when an additional Ag$^+$ particle hops into a new trapping site.

The well-defined active switching area in the a-Si pillar structure along with the fine control offered by the CMOS compatible fabrication process enables detailed studies to explore the unique characteristics offered by the resistive switching devices. One direct consequence of the filament formation model is that the switching rate will be bias-dependent, since unlike electron tunneling, the hopping of the Ag$^+$ particles is a thermally activated process and the rate is determined by the bias-dependent activation energy $E_a'(V)$:

$$\Gamma = 1/\tau = \nu e^{-E_a'(V)/k_B T}, \tag{1}$$

where $k_B$ is Boltzmann's constant, T is the absolute temperature, $\tau$ is the characteristic dwell time and $\nu$ is the attempt frequency. As indicated in FIG. 2(d), the activation energy may be lowered by the application of the bias voltage, resulting in bias-dependent wait time and switching rates.

This effect has been verified through a study of the wait time for the first transition (i.e., the first current step in FIG. 1(c)) as a function of bias voltage. The wait time was measured by applying a square pulse with a given voltage magnitude to the device in OFF state and measuring the lapse in time t until the first sharp increase in current. The device was then erased by a negative voltage pulse and the measurement was repeated. FIGS. 2(a)-(c) show the histograms of the wait time for the first transition at bias voltages of 2.6 V, 3.2 V and 3.6 V on the same device. Because the stochastic nature of the switching process, the wait time should follow Poisson distribution and the probability that a switching occurs within Δt time t is given by:

$$P(t) = \frac{\Delta t}{\tau} e^{-t/\tau}. \tag{2}$$

Figure 2E:
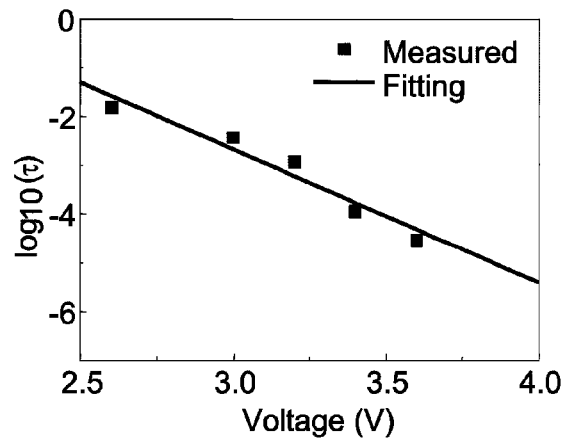
FIG. 2(e) is a graph depicting the relationship between switching time and bias voltage for an a-Si device such as shown in FIG. 1(a)

The histograms in FIGS. 2(a)-(c) can be fitted to Equation 2 using $\tau$ as the only fitting parameter, thereby yielding $\tau$ values of 15.3 ms, 1.2 ms and 0.029 ms, respectively. These graphs show that $\tau$ is a strong function of V and decreases by almost $10^3$ when V is increased by only 1 V. FIG. 2(e) shows the distribution of the measured $\tau$ at 5 different bias voltages along with a fit assuming exponential decay, treating $\tau_0$ and $V_0$ as fitting parameters:

$$\tau(V) = \tau_0 e^{-V/V_0}, \tag{3}$$

It is interesting to note the physical meaning of $V_0$ in Equation 3. From FIG. 2(d) and to a first order, $E_a' = E_a - Ed$, where $E_a$ is the activation energy at zero bias, E is the electric field and d is the distance between the Ag$^+$ trapping sites. If it is assumed that most of the voltage is dropped across the Ag$^+$ chain and the Ag$^+$ particles are evenly distributed within the chain then, to a first order $E_a'(V) = E_a - V/2n$, where n is the number of the Ag$^+$ sites. Equation 3 can then be directly derived from Equation 1, where:

$$\tau_0 = 1/\nu e^{E_a/k_B T} \text{ and } V_0 = 2nk_B T.$$

Significantly, the $V_0$ value of 0.155V inferred from the fitting in FIG. 2(e) is very close to that predicated by this simple model, $V_0 = 2nk_B T \approx 0.156V$, assuming there are 3 Ag$^+$ sites in the filament (n=3), as suggested by the number of major current steps in the semi-log I-V plot in FIG. 1(c). Equation 3 clearly suggests that the wait time is strongly bias dependent, and that it can be reduced exponentially by increasing the applied bias.

Figure 3A:
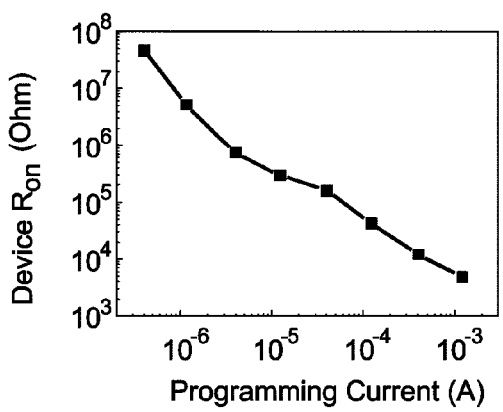
FIG. 3(a) shows the result of programming a typical a-Si device using different series-connected control resistors or programming current levels controlled by other means.
Figure 3B:
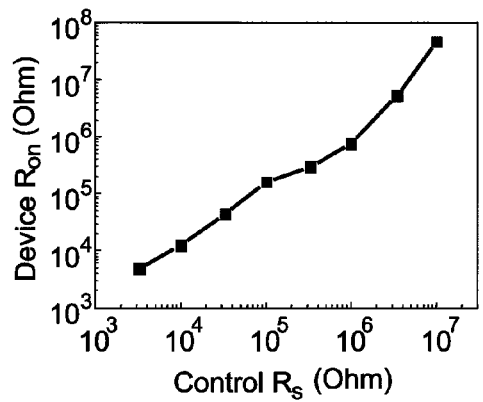
FIG. 3(b) depicts the correlation between the final resistance of the programmed a-Si device and the selected control resistance used to program the device.

The bias-dependent switching characteristics have significant implications on the device operation. First, the switching essentially does not have a "hard" threshold voltage even though the switching can be very sharp—see FIG. 1(c), since there is always a finite probability for switching to occur even at relatively low bias voltages. On the other hand, threshold voltages can be defined for a given programming pulse width. For example, if the threshold is defined as the voltage above which 95% success rate is achieved, then the threshold voltage is 3.3V for a 1 ms pulse, and 5.1V for a 10 ns pulse width. Second, multi-level bit storage can be achieved in these devices by adjusting the external circuit resistance. When a series-resistor is attached to the device, the voltage across it will be reduced after the initial switching, resulting in significantly longer wait time for the subsequent switching events. As a result, a partially formed filament can be created if the programming pulse is removed before the subsequent switching events can occur, resulting in intermediate resistance values between the ON and OFF states. FIG. 3(a) shows the final device resistance obtained on the same device using identical programming pulses but with different series resistor values. The $8 = 2^3$ different resistance levels obtained on the device suggest that each device as a memory component can store up to 3 bits of information. The device resistance R also correlates well with the resistance $R_S$ of the series resistor, as shown in FIG. 3(b), since the voltage divider effect that causes the elongation of the wait time is most pronounced when the device resistance becomes comparable with $R_S$.

Figure 5:
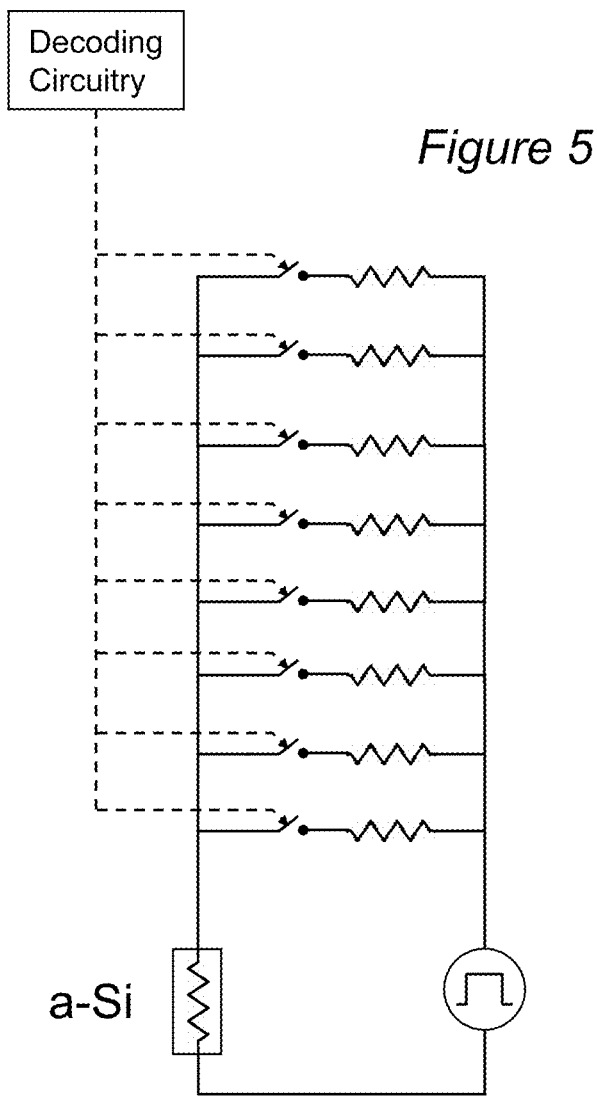
FIG. 5 is a schematic showing a control circuit that uses control resistors for multi-level number storage in a single a-Si device.

Various approaches can be used to implement the selective programming of multi-level numbers into the a-Si device. As used herein, a multi-level number is a number having more than two (binary) levels or values, such as a base-three digit or number, base-four number, etc. Multi-level number storage can be used to store multiple bits of binary information; for example, a four-level a-Si storage cell can store two bits of binary data in a single a-Si cell, and an eight-level cell can store three bits of binary data. When used in a digital circuit device, the memory cell can include a suitable control circuit to program a binary or other number into the a-Si device. Such circuitry is within the level of skill in the art and an exemplary diagram of one such control circuit is shown in FIG. 5. The illustrated control circuit can be used to set the a-Si structure at any one of eight resistance levels by insertion or removal of additional resistance into the circuit in series with the a-Si structure. For this purpose, a decoding circuit can be used to convert three bit binary input data into the corresponding control signals used to switch the control resistors into or out of the circuit. In this way the decoding circuit is operable to adjust the resistance of the a-Si structure to any of a plurality of desired resistance values by setting the total control resistance in series with the a-Si structure to an associated resistance value. As will be appreciated, the control circuit of FIG. 5 is diagrammatic only and specific circuit arrangements for writing, erasing, and reading the resistance value of the a-Si structure will be known to those skilled in the art.

A control circuit such as in FIG. 5 can be used to carry out the various steps discussed above for adjusting the resistance of the a-Si structure. These steps together comprise a method that can be used to adjust the resistance of the a-Si structure between a beginning resistance value and a final resistance value. In general, the method includes the steps of electrically connecting the a-Si structure (which is a first resistive device) in series with a second resistive device and applying a voltage across the series-connected resistive devices. As discussed above, the second resistive device is a control resistance comprising either one or a combination of two or more control resistors. The control resistance is selected (e.g., by the decoding circuit) based on the desired final resistance value for the a-Si structure. Also, as discussed herein, the final resistance value of the a-Si structure can be set at least in part based on the magnitude of the applied voltage, the duration of the applied voltage, or both. Thus, the applying step can comprise setting the final resistance value by applying a voltage of a selected magnitude and duration across the series-connected resistance devices. Furthermore, as noted above, multi-level number storage can be implemented using the a-Si structure such that the final resistance value is one of a plurality of selectable resistance values. For this, the step of electrically connecting the a-Si structure in series with the control resistance further comprises electrically forming the control resistance by selectively inserting or shunting one or more control resistors in series with the a-Si structure based on a chosen one of the selectable resistance values. This again can be done using the decoding circuit of FIG. 5 or using other suitable circuitry that will be apparent to those skilled in the art. To reset the a-Si device back to the beginning resistance value, an opposite-polarity reset voltage is applied to the a-Si structure.

Figure 6:
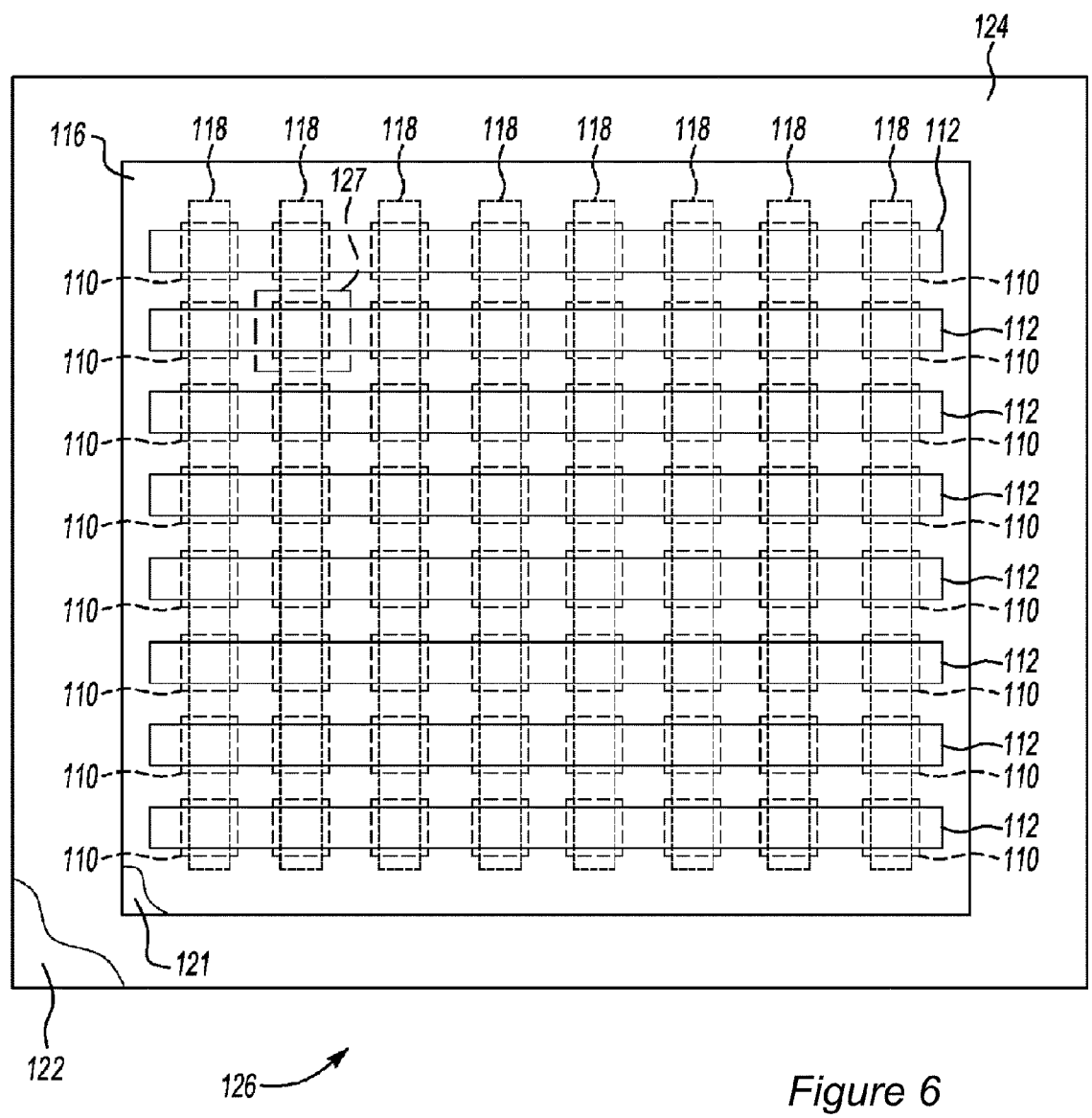
FIG. 6 is a plan view, partially broken away, of a memory device using a-Si structures such as are shown in FIG. 1.

The a-Si structure can be used as a memory cell of a digital non-volatile memory device having a number of a-Si memory cells arranged in an array or other suitable structure. FIG. 6 depicts an exemplary embodiment such as could be used to form ultra-high density memory devices. The illustrated memory device 126 includes a silicon substrate 122 with a $SiO_2$ top layer 124 and a crossbar structure formed from a set of parallel metal electrodes 112 orthogonally overlapping a set of parallel p-Si electrodes 118. An a-Si resistive device (generally outlined at 110) is located at each intersection of the two types of electrodes. Numbered elements of FIG. 6 differing by 100 relative to numbered elements of FIG. 1 can have similar, although not necessarily identical, constructions and functions to the numbered elements of FIG. 1. The resistive devices 110 comprise individually addressable memory cells of the memory device 126. Located between the upper set of electrodes 112 and the lower set of electrodes 118 is a SOG or other insulating layer 116 containing the a-Si structure at each memory cell 110. The insulating layer 116 can extend down to the substrate's upper layer 124 and thereby isolate adjacent electrodes 118 from each other, or a separate insulating layer 121 underneath the layer 116 can be used for this purpose. Also, rather than extending the p-Si electrodes 118 between adjacent cells in a column, they can be restricted to each cell site and a Pt or other suitable metal electrode can be used to interconnect the p-Si electrodes within each column. Other variations will become apparent to those skilled in the art. A cell size 127 for the devices 110 is approximately 0.003 $\mu m^2$. In other examples, the cell size 127 may be less than 0.003 $\mu m^2$ or less than or equal to 0.01 $\mu m^2$.

Each memory cell 110 can include a single a-Si structure and, as discussed above, the a-Si structure can have an adjustable resistance that is used to implement a single bit of digital storage, or can have an adjustable resistance that is set to any of three or more resistances each of which corresponds to a different stored number. In this way, each memory cell is capable of multi-level number storage. For this purpose, the memory device 126 can include a control circuit such as in FIG. 5 to permit writing of multi-level data at any selected memory cell 110.

Rather than being used for bit or multi-level number storage, the a-Si structure can be operated via a method that switches it between the ON and OFF states discussed above. This can be done by applying a voltage across the a-Si structure, wherein the applied voltage has a magnitude and duration that are selected so as to achieve a predetermined probability of the a-Si device switching from the OFF state to the ON state. The predetermined probability of successful switching can be, for example, 95% or can be any other percentage desired or required for a particular application of the a-Si device.

Figure 3C:
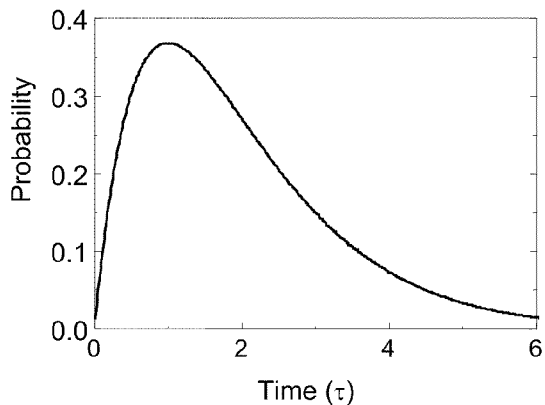
FIG. 3(c) is a graph of the probability of a single, discrete resistance switching event over time for a typical a-Si device when applying a given bias voltage without any series connected control resistor.
Figure 3E:
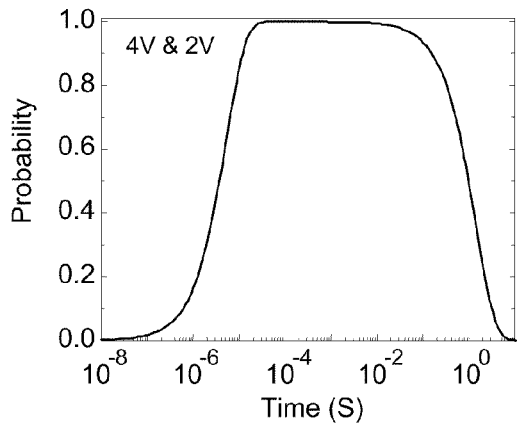
FIG. 3(e) is a graph of the probability of a single, discrete resistance switching event over time for a typical a-Si device when using a series connected control resistor.
Figure 3D:
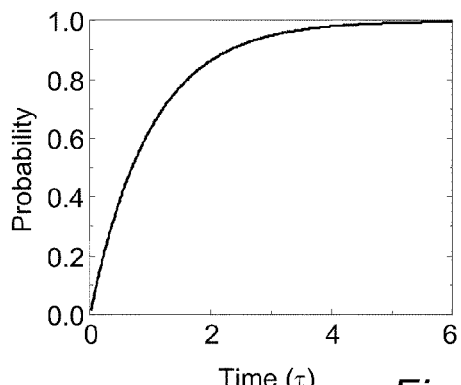
FIG. 3(d) is a graph of the probability of having at least one resistance switching event over time for a typical a-Si device when applying a given bias voltage without any series connected control resistor.

As indicated above, the successful operation of the a-Si device depends not only on the amplitude, but also on the duration time of the bias. The switching control requirements also depend on whether digital switching (e.g. as single-bit memories) or analog operations (e.g. as interconnects) are desired. For the Poissonian processes discussed above, FIG. 3(c) plots the probability of exactly one switching event occurring during time t while FIG. 3(d) plots the probability of at least one switching event occurring during time t. They correspond to the case with no external series resistance and a single switching rate $1/\tau$ applies to the step-wise filament formation process. It is clear then that the device acts as an excellent digital switch for long-enough programming pulses (e.g., 95% success rate is achieved for $t_{pulse} > 3\tau$). On the other hand, for multi-level number storage or analog operations of the switch, the pulse width has to be optimized. For example, $t_{pulse}$ needs to be centered at τ for the highest probability that only the first switching occurs. Even so, the maximum success rate is only ~38%, as indicated in FIG. 3(c). However, the success rate for multi-bit operations can be significantly improved by the addition of the external series resistance, which dramatically reduces the subsequent switching rates. FIG. 3(e) plots the probability that only the first switching event will occur in a simplified two-step filament formation process in which two different rates are used:

$$P(t) = \frac{\tau_2}{\tau_1 - \tau_2}(e^{-t/\tau_1} - e^{-t/\tau_2}), \quad (4)$$

where $\tau_1$=3.36 us and $\tau_2$=1.30 s corresponding to the switching rates when the voltage across the device changes from 4V (before the first switching event and R>>$R_S$) to 2V (after the first switching event and R=$R_S$) respectively, as a result of the voltage divider effect after the first switching event. A much higher success rate of greater than 99% can now be achieved for $5\tau_r<t_{pulse}<0.01\tau_2$ (about 13 ms time margin at 4 V bias) to limit the switching to the first event only. In addition, similar exhibited characteristics are expected from other resistive switching devices since many of them involve some sort of activation energy process, e.g. the diffusion of ions and the redox processes.

Figure 4A:
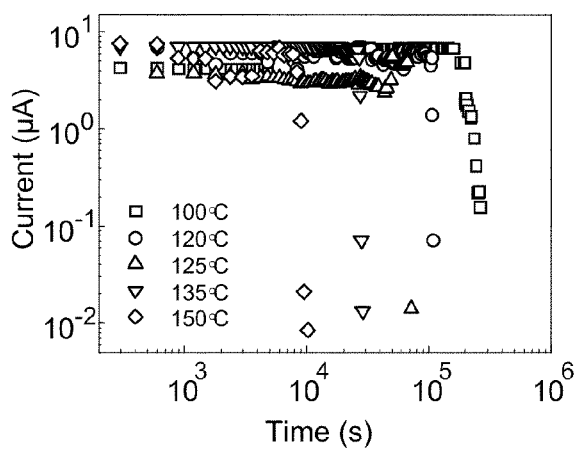
FIG. 4(a) is a plot of the wait time for an ON-to-OFF resistance transition when no bias voltage is applied to an a-Si device such as shown in FIG. 1(a)
Figure 4B:
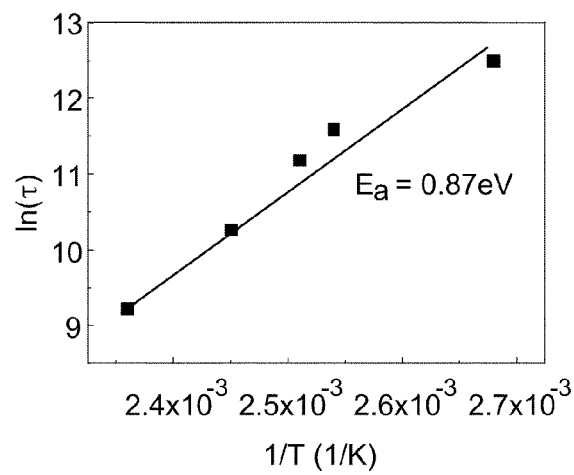
FIG. 4(b) is a graph of the wait time versus temperature.

The activation energy of the barriers can be extracted from temperature dependence of the wait time from Equation 1. FIG. 4(a) shows the time dependent resistance change at zero-bias at temperatures from 100° C. to 150° C. for a device originally programmed in the ON state. With reference back to FIG. 1(c), the sudden transitions to the OFF state correspond to the retrieval of the Ag filament by the thermally activated hopping of the Ag$^+$ particle towards the top electrode from the trapping site nearest to the bottom electrode, as verified by the good fitting in the Arrhenius type plot of the wait time t versus $1/k_BT$ that is shown in FIG. 4(b). The activation energy for the ON/OFF transition can be extracted to be 0.87 eV for this device from the slope of the Arrhenius plot and the retention time at room temperature can be estimated to be 6 years from extrapolation.

Figure 7:
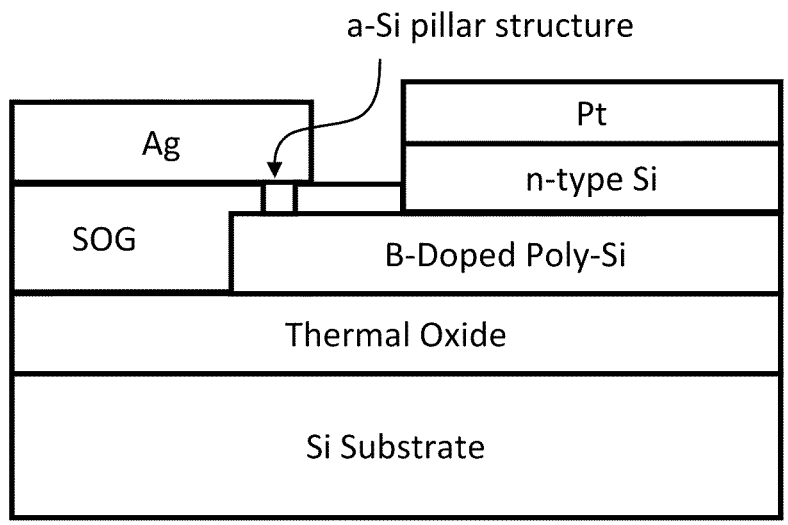
FIGS. 7-9 are diagrammatic views of different embodiments of a single cell a-Si resistive device having a built-in diode.

When incorporated into memory arrays such as shown in FIG. 6 or when otherwise necessary or desirable for a particular application, the a-Si device can be constructed with an intrinsic diode in the form of a p-n junction. This can be incorporated during fabrication by further including an n-type layer between the p-type poly-Si electrode and the second metal (e.g., platinum) electrode. An example of this is shown in FIG. 7 which can be identical to the a-Si resistive device 10 of FIG. 1 except for the added n-type layer under the Pt electrode. When used in a memory array of the crossbar type, this construction can be used to prevent cross-talk between adjacent devices since forward conducting current flowing out of one cell through its diode will be blocked by the (now reverse-biased) diode of the adjacent cell.

Figure 8:
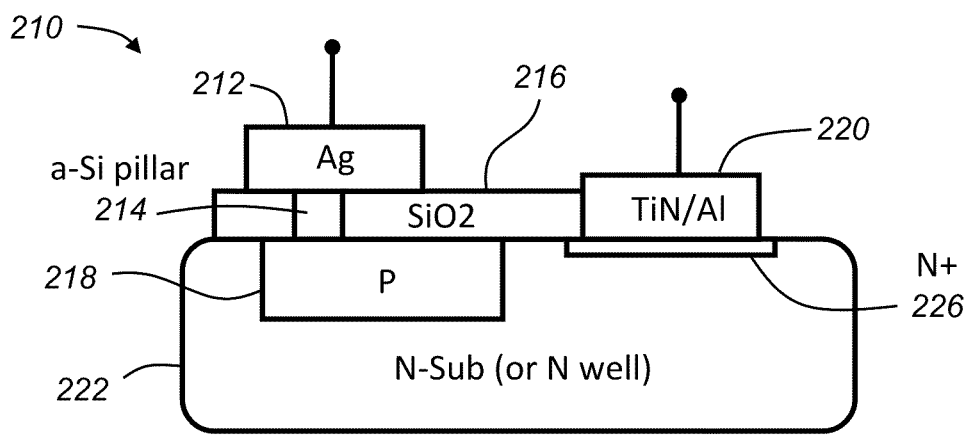
Figure 9:
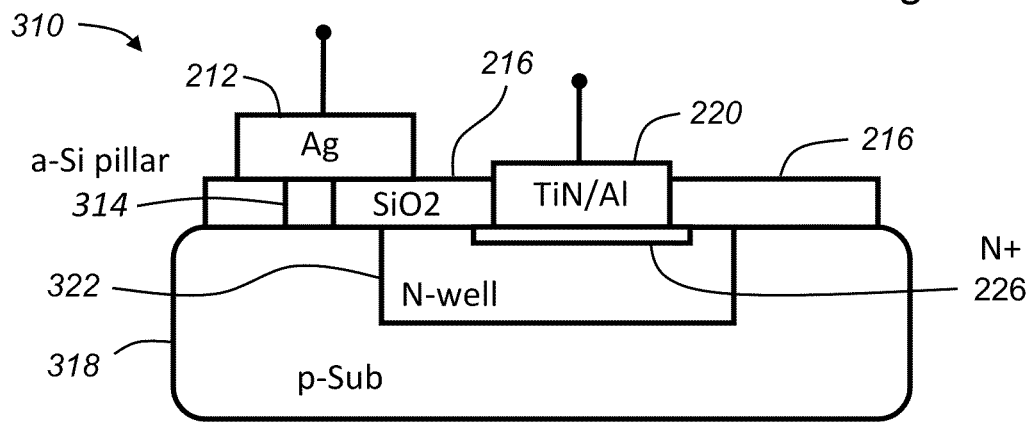

FIG. 8 depicts another embodiment of a single cell a-Si resistive device 210 that includes a built in diode which can be formed using conventional CMOS fabrication techniques. Numbered elements of FIG. 8 differing by 200 relative to numbered elements of FIG. 1 can have similar, although not necessarily identical, constructions and functions to the numbered elements of FIG. 1. The device 210 can be built up using a N-type crystalline silicon substrate 222. P-type silicon region 218 can be a poly-Si layer formed by conventional CMOS processes such as ion implantation or diffusion method. The P-type region 218 and Ag terminal 212 make contact to a-Si pillar 214 which can change its resistance depending on applied bias, as described above. Insulating layer 216 can be formed by SOG (spin-on-glass) or CVD (chemical vapor deposition) methods. A second metal electrode 220 is formed in contact with the substrate layer 222, and can be, for example, a TiN/Al metal stack which has good electrical contact. Highly doped N-type region 226, which can be formed by ion implantation, further ensures good electrical contacts between N-Sub 222 and the electrode 220. Because P-type layer 218 is built on a N-type silicon substrate 222, they together form a diode. Hence, when the electrodes 212 and 220 are used for external contacts, the entire structure comprises an a-Si resistive device having a series-connected PN diode. FIG. 9 depicts a structure 310 similar to that of FIG. 8, with the primary difference being the type of starting substrate which can be a p-type substrate 318. In this case, N-type region 222 is then formed on the substrate 218 (by ion implantation or diffusion methods), which again gives the a-Si resistive device a series-connected PN diode.

Figure 10:
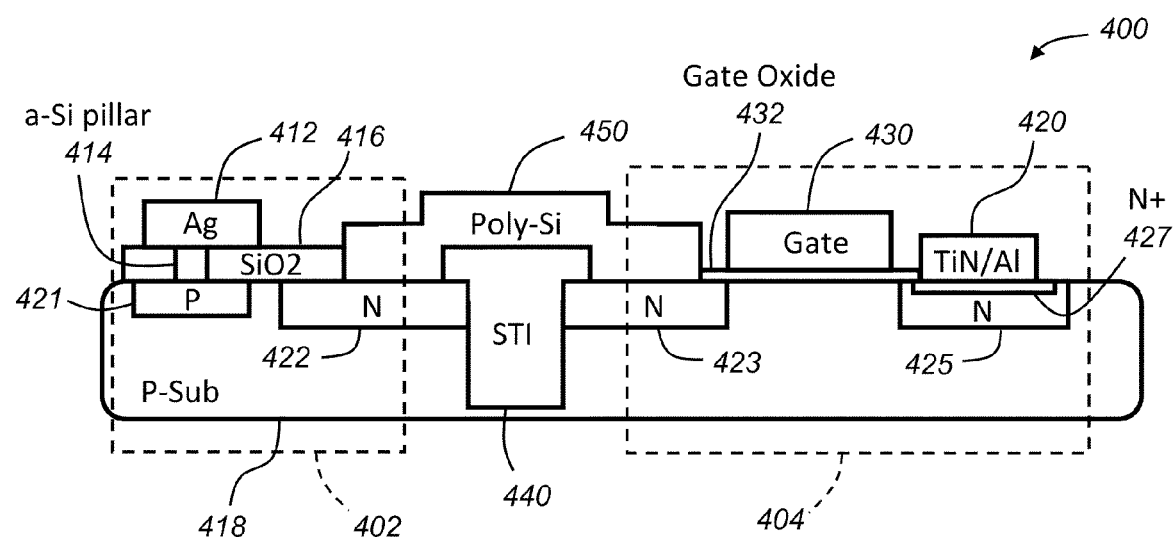
FIGS. 10 and 11 are diagrammatic views of different embodiments of an a-Si resistive device with built-in diode and a field effect transistor (FET) that operates as a gate-controlled variable resistor for multi-level programming of the a-Si device.
Figure 11:
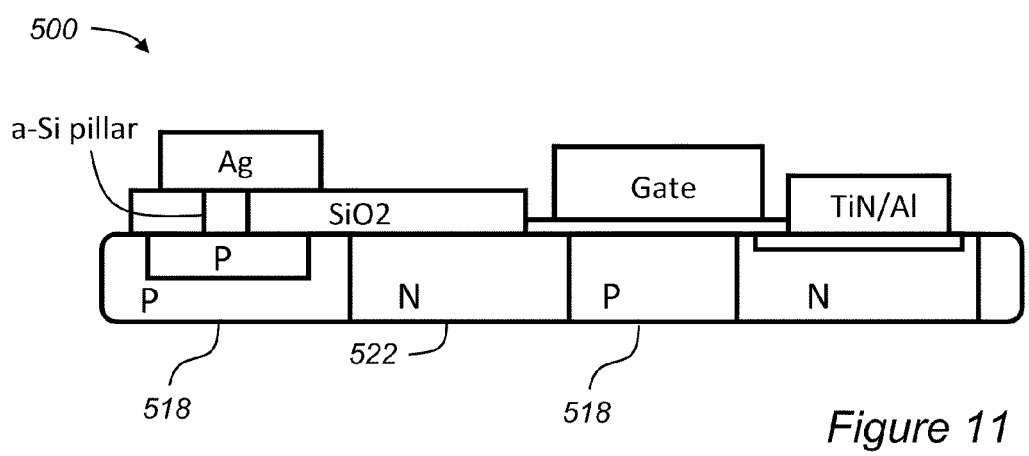

FIG. 10 depicts one exemplary implementation of an a-Si resistive device 400 that includes some of the control circuitry used to program the a-Si structure to any of a number of different resistances to thereby permit multiple bit or other multi-level number storage in the device. This structure 400 that can be built by conventional CMOS fabrication processes. The structure combines an a-Si resistive device 402 (with PN diode) and a FET 404 that can act as a gate bias controlled resistor. The a-Si device 402 includes an a-Si nanopillar 414 embedded in an insulating layer 416 beneath of top electrode that can be silver or other suitable metal. The FET 404 includes a gate 430 formed over a gate oxide layer 432. Depending on applied bias at the gate 430, the resistance between two N-type regions 423, 425 can be controlled to thereby create a variable resistor. The N-type region 425 is connected to the second metal electrode 420 via a highly-doped N-type region 427. The structure 400 can be fabricated on P-type silicon substrate 418. Another P-type region 421 has different resistance value than P-Sub 418 to control the device performance. A poly-Si interconnection 450 bridges the a-Si resistive device 402 and the N-type FET 404 by connecting two N-type regions 422, 423. STI (shallow trench isolation) 440 is a standard CMOS fabrication technique which can suppress direct leakage current though the P-Sub 418. If the thickness of the active substrate (body) is thin (<1 um), then the structure of device 400 can be simplified as shown in FIG. 11. This essentially involves removing elements 440, 450, and 423 from the device 400 of FIG. 10. The substrate 518 can be P-type Silicon. The N type region 522 can serve as an N part for a PN diode and a part of the FET as well, resulting in compact device size.

Figure 12:
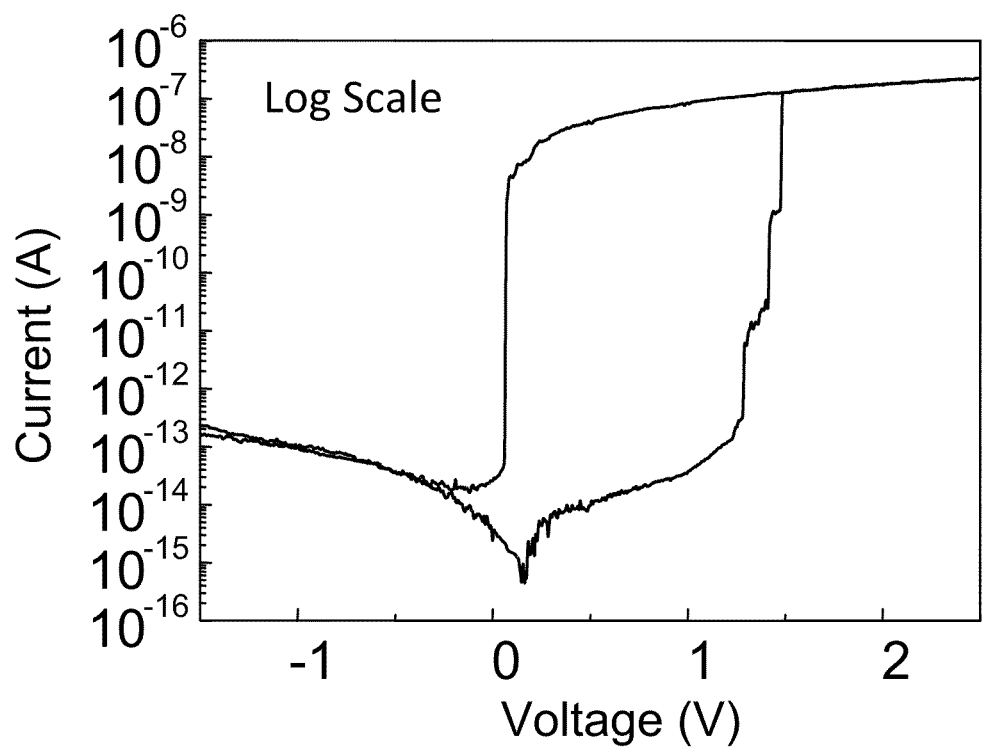
FIGS. 12 and 13 depict exemplary intrinsic diode characteristics for the basic a-Si resistive device disclosed herein.
Figure 13:
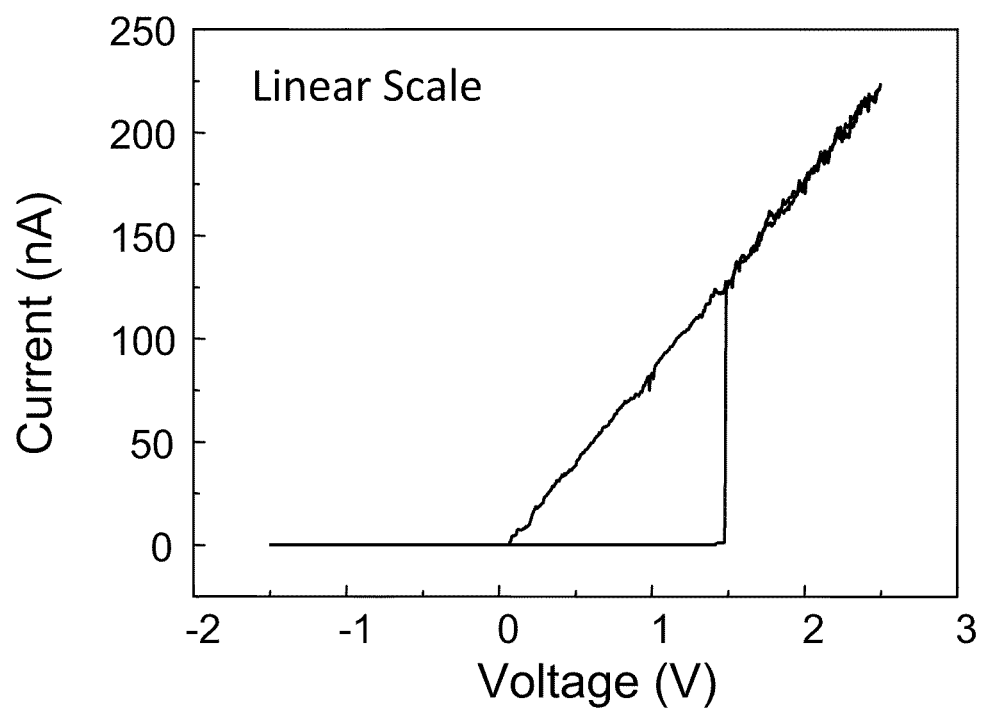

Apart from the use of an added n-type layer to create a built-in diode as described above, the basic a-Si resistive device disclosed herein can itself exhibit an intrinsic diode characteristic. FIGS. 12 and 13 depict an example of this diode characteristic. As shown in these figures, when the memory device is in its ON state, current can only flow through the device at positive bias but not at negative bias. This intrinsic diode characteristic can also be used to regulate current flow and prevent crosstalk in crossbar arrays. The intrinsic diode characteristic can be obtained by controlling the a-Si deposition conditions and/or by controlling the programming current. Without wishing to being limited to any particular theory of operation, it is believed that the probable cause of this intrinsic characteristic is a built-in electric field at the interface, and/or a shallow trap potential between PECVD a-Si/poly-Si. Naturally retracted Ag-mobile ions can be again injected to the close interface with much smaller bias than the usual programming bias so when reading the device state with a small positive read voltage an ON state can still be obtained. This process is different from the erase process in which Ag mobile ion retracted to another stable position with sufficient barrier energy.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example", "for instance", "such as", and "like", and the verbs "comprising", "having", "including", and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A non-volatile solid state resistive device, comprising:
a first electrode;
a p-type polycrystalline silicon-bearing second electrode;
a non-crystalline silicon nanostructure electrically connected between said electrodes such that said nanostructure has a resistance that is adjustable in response to a voltage being applied to said nanostructure via said electrodes; and
a control circuit operable to adjust the resistance of said silicon nanostructure between more than two resistance values.

2. A resistive device as defined in claim 1, wherein said non-crystalline silicon nanostructure comprises an amorphous silicon-containing material.

3. A resistive device as defined in claim 1, wherein said polycrystalline silicon-bearing second electrode comprises a p-type doped poly-silicon material.

4. A resistive device as defined in claim 1, wherein said silicon nanostructure comprises a pillar having opposed end faces with each electrode being in contact with a different one of said end faces.

5. A resistive device as defined in claim 4, further comprising an insulating layer; and
wherein the pillar is formed within the insulating layer.

6. A resistive device as defined in claim 1, wherein said silicon nanostructure is nanoscale in all three spatial dimensions.

7. A resistive device as defined in claim 1, wherein the non-crystalline silicon nanostructure comprises an approximate diameter selected from a range of approximately 30 nm to approximately 60 nm.

8. A resistive device as defined in claim 1, further comprising one or more resistive components electrically connected in series with said silicon nanostructure.

9. A resistive device as defined in claim 1, further comprising a control circuit that includes said one or more resistive components along with circuitry operable to selectively alter the amount of series resistance connected to said silicon nanostructure.

10. A resistive device as defined in claim 1, further comprising:
a second metal electrode adjacent to said p-type polycrystalline silicon-bearing second electrode at a location near said silicon nanostructure; and
wherein the non-crystalline silicon nanostructure is adjacent to the p-type polycrystalline silicon bearing second electrode.

11. A resistive device as defined in claim 1, wherein said control circuit provides a control resistance connected in series with said silicon nanostructure, said control circuit being operable to adjust the resistance of the silicon nanostructure to any of the resistance values by setting the control resistance to an associated resistance value.

12. A resistive device as defined in claim 1, further comprising an n-type doped silicon layer in contact with said p-type polysilicon silicon-bearing second electrode such that said resistive device includes a diode in series with said silicon nanostructure.

13. A resistive device as defined in claim 1, wherein said first electrode is a metal electrode that, in the presence of an applied voltage across said electrodes, supplies metal ions that form a filament within said silicon nanostructure.

14. A resistive device as defined in claim 13, wherein said first electrode comprises silver.

15. A resistive device as defined in claim 13, further comprising a second metal electrode in contact with said p-type polycrystalline silicon-bearing second electrode at a location near said silicon nanostructure.

16. A resistive device as defined in claim 15, wherein said second metal electrode is spaced from said silicon nanostructure by no more than 100 nm.

17. A digital non-volatile memory device having at least one memory cell that comprises the resistive device defined in claim 1.

18. An electronic circuit having an electrical interconnect that comprises the resistive device defined in claim 1.

19. A memory device comprising a non-volatile solid state resistive device, comprising:
a first electrode;
a p-type polycrystalline silicon-bearing second electrode;
a non-crystalline silicon nanostructure electrically connected between said electrodes such that said nanostructure has a resistance that is adjustable in response to a voltage being applied to said nanostructure via said electrodes;
wherein the non-crystalline silicon nanostructure of said non-volatile solid state resistive device is the only silicon nanostructure in said memory device having an adjustable resistance, and wherein the adjustable resistance can be set to any of three or more resistances each of which corresponds to a different stored number, whereby said memory device is capable of multi-level number storage.

20. A memory device as defined in claim 19, further comprising a control circuit for setting a value for the adjustable resistance based on a number to be stored in the memory device.

21. A memory device as defined in claim 20, wherein the control circuit includes a control resistance in series with said non-crystalline silicon nanostructure.

22. The memory device as defined in claim 19 wherein the p-type polycrystalline silicon-bearing second electrode comprises p-type polysilicon.

23. The memory device as defined in claim 19 wherein the first electrode is selected from a group consisting of: silver, gold, aluminum.

24. The memory device as defined in claim 19 further comprising a plurality of CMOS devices coupled to the first electrode.

25. The memory device as defined in claim 19 wherein the non-crystalline silicon nanostructure comprises amorphous silicon-containing material.

26. A non-volatile solid state resistive device, comprising:
a first metal electrode;
a p-type poly-silicon electrode;
an insulating layer located at least partially between said electrodes;
an amorphous silicon structure embedded in said insulating layer and having opposing end faces each connected to a different one of said electrodes, wherein said first electrode comprises a metal that, in the presence of an applied voltage across said electrodes, supplies metal ions that form a filament within said silicon structure, whereby said silicon structure exhibits a resistance that can be adjusted based on the applied voltage; and
a second metal electrode in contact with said poly-silicon electrode at a location that is no more than 100 nm from said silicon structure.

27. A resistive device as defined in claim 26, wherein said insulating layer comprises a spin-on-glass layer.

28. The resistive device as defined in claim 26 wherein the first metal electrode is selected from a group consisting of: silver, gold, aluminum.

29. The resistive device as defined in claim 26 further comprising a plurality of CMOS devices coupled to the first metal electrode.

30. The memory device as defined in claim 26 wherein the amorphous silicon structure comprises amorphous silicon-containing material.

* * * * *

UNITED STATES PATENT AND TRADEMARK OFFICE
CERTIFICATE OF CORRECTION

PATENT NO. : 8,687,402 B2
APPLICATION NO. : 12/575921
DATED : April 1, 2014
INVENTOR(S) : Wei Lu, Sung Hyun Jo and Kuk-Hwan Kim Page 1 of 1

It is certified that error appears in the above-identified patent and that said Letters Patent is hereby corrected as shown below:

In the specification

In column 9, line 16, replace "us" with --$\mu$s--.

In column 9, line 22, replace "$5\tau_r$" with --$5\tau_1$--.

Signed and Sealed this
Third Day of May, 2016

Michelle K. Lee
*Director of the United States Patent and Trademark Office*